(12) United States Patent
Chen

(10) Patent No.: US 12,419,004 B2
(45) Date of Patent: Sep. 16, 2025

(54) SERVER APPARATUS AND ELASTIC PIECE THEREOF

(71) Applicant: Wistron Corporation, New Taipei (TW)

(72) Inventor: Yung-Chen Chen, New Taipei (TW)

(73) Assignee: Wistron Corporation, New Taipei (TW)

( * ) Notice: Subject to any disclaimer, the term of this patent is extended or adjusted under 35 U.S.C. 154(b) by 253 days.

(21) Appl. No.: 18/196,426

(22) Filed: May 11, 2023

(65) Prior Publication Data

US 2024/0244786 A1 Jul. 18, 2024

(30) Foreign Application Priority Data

Jan. 17, 2023 (TW) .................................. 112200581

(51) Int. Cl.
*H05K 7/14* (2006.01)

(52) U.S. Cl.
CPC .................................. *H05K 7/1489* (2013.01)

(58) Field of Classification Search
None
See application file for complete search history.

(56) References Cited

U.S. PATENT DOCUMENTS

| 2006/0044776 | A1* | 3/2006 | Xu | G06F 1/184 361/803 |
| 2014/0285977 | A1* | 9/2014 | Li | G11B 33/128 361/747 |
| 2015/0192970 | A1* | 7/2015 | Jau | G11B 33/128 361/679.33 |
| 2017/0020021 | A1* | 1/2017 | Mao | H05K 7/1487 |
| 2021/0068317 | A1* | 3/2021 | Wang | G06F 1/187 |

* cited by examiner

*Primary Examiner* — Allen L Parker
*Assistant Examiner* — Christopher L Augustin
(74) *Attorney, Agent, or Firm* — Winston Hsu

(57) ABSTRACT

A server apparatus includes a bottom board, a tray, a host device disposed on the tray and having a first connector, and an elastic piece. A pin protrudes from the bottom board and is inserted into a hole of the tray to make the tray movably connected on the bottom board. The elastic piece includes an elastic arm and a body connected on the tray. The elastic arm extends from the body to pass through a slot of the tray, so as to abut against the bottom board for supporting the tray above the bottom board when the tray is connected on the bottom board. Therefore, the tray can move a first distance relative to the bottom board.

20 Claims, 5 Drawing Sheets

SERVER APPARATUS AND ELASTIC PIECE THEREOF

BACKGROUND OF THE INVENTION

1. Field of the Invention

The present disclosure relates to a server apparatus and an elastic piece thereof, and more specifically, to a server apparatus utilizing an elastic piece to support a tray above a bottom board and an elastic piece thereof.

2. Description of the Prior Art

With higher and higher demands for a server apparatus' performance in the market, the server apparatus usually allows expansion connection of external devices, such as various types of expansion cards or processor modules (e.g., graphic processing modules), for improving the processing capability of the server apparatus. In general, the aforesaid external devices are connected to a host device of the server apparatus via connectors.

However, due to limited internal space of the server apparatus, the external device may easily be misaligned with the host device during the aforesaid expansion connection process, so as to cause an assembly problem that the connectors are not assembled smoothly or even struck. Thus, it may cause a time-consuming and strenuous expansion connection process and easily damage the connectors.

SUMMARY OF THE INVENTION

The present disclosure provides a server apparatus including a bottom board, a tray, a host device, and at least one elastic piece. The bottom board has at least one pin. The tray has at least one hole and at least one slot. The pin is located in the hole to make the tray movably connected on the bottom board. The host device is disposed on the tray and has at least one first connector. The at least one elastic piece includes a body and at least one elastic arm. The body is connected on the tray. The elastic arm extends from the body to pass through the slot of the tray and abut against the bottom board when the tray is connected on the bottom board, for allowing the tray to move a first distance relative to the bottom board.

The present disclosure further provides an elastic piece suitable for supporting a tray above a bottom board of a server apparatus. The bottom board has at least one pin. The tray has at least one hole and at least one slot. The pin is located in the hole to make the tray movably connected on the bottom board. The elastic piece includes a body and at least one elastic arm. The at least one elastic arm extends from the body to pass through the slot of the tray and abut against the bottom board when the tray is connected on the bottom board, for allowing the tray to move a first distance relative to the bottom board.

These and other objectives of the present disclosure will no doubt become obvious to those of ordinary skill in the art after reading the following detailed description of the preferred embodiment that is illustrated in the various figures and drawings.

DETAILED DESCRIPTION

Figure 1:
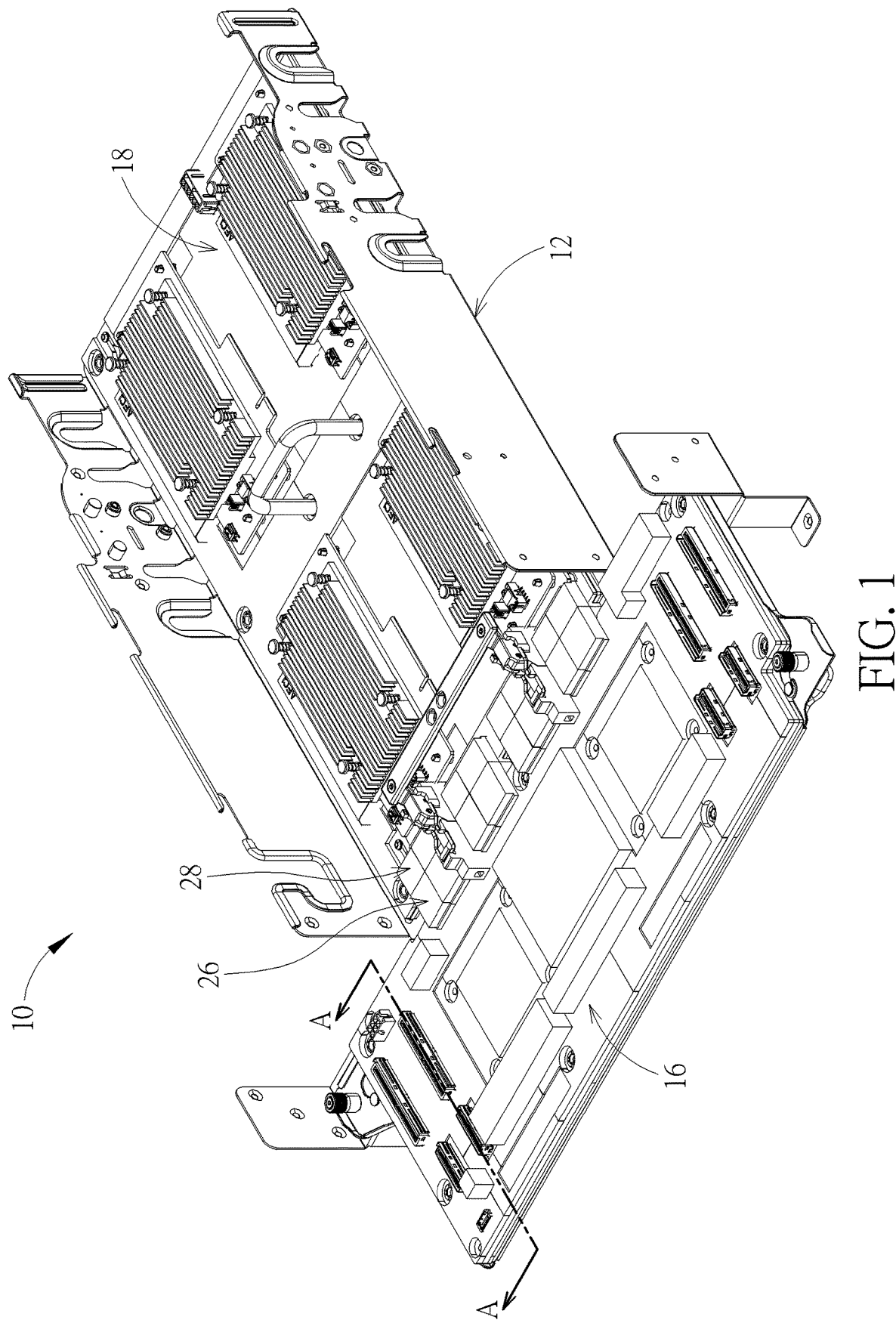
FIG. 1 is an assembly diagram of a server apparatus according to an embodiment of the present disclosure.
Figure 2:
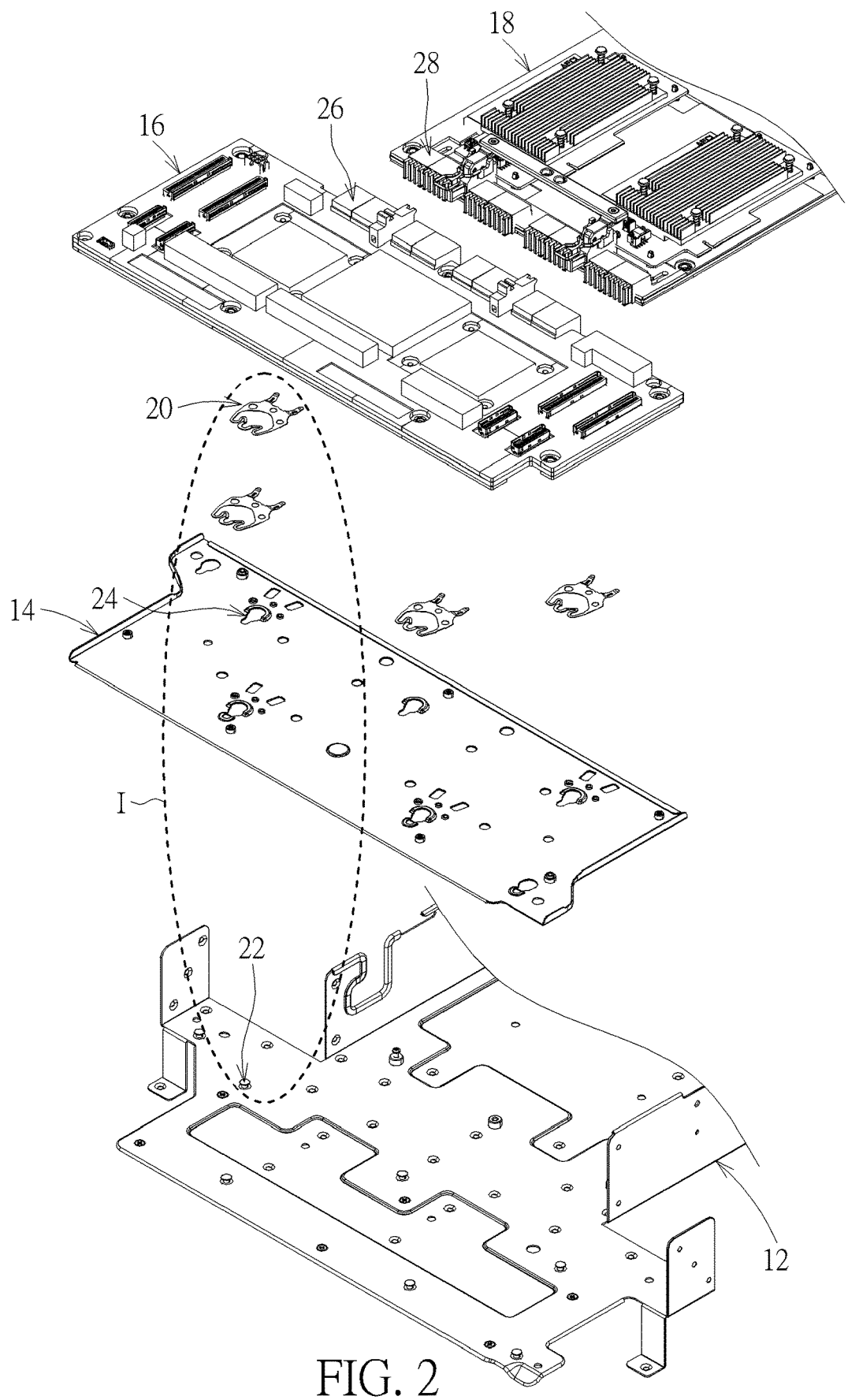
FIG. 2 is an exploded diagram of the server apparatus in FIG. 1.

Please refer to FIG. 1 and FIG. 2. FIG. 1 is an assembly diagram of a server apparatus 10 according to an embodiment of the present disclosure. FIG. 2 is an exploded diagram of the server apparatus 10 in FIG. 1. As shown in FIG. 1 and FIG. 2, the server apparatus 10 includes a bottom board 12, a tray 14, a host device 16, and at least one elastic piece 20 (four shown in FIG. 2, but not limited thereto). The bottom board 12 has at least one pin 22 (seven shown in FIG. 2, but not limited thereto), and the tray 14 has at least one hole 24 (seven shown in FIG. 2, but not limited thereto) correspondingly. Accordingly, the pin 22 can be located in the hole 24 to make the tray 14 movably connected on the bottom board 12 for subsequent device placement. The host device 16 could be a mainboard module commonly applied to a server apparatus (the related description for components (e.g., PCI-E cards and central processing units) installed on the mainboard module is commonly seen in the prior art and omitted herein). The host device 16 is disposed on the tray 14 and has at least on first connector 26 (eight shown in FIG. 2, but not limited thereto). In the practical application, the floating support design of the server apparatus 10 could be applied to connection of the host device 16 and an external device (but not limited thereto). For example, the server apparatus 10 could further include an external device 18. The external device 18 could be an external expansion module (e.g., graphic processing modules, but not limited thereto) commonly applied to a server apparatus for improving the processing capability or data storage capacity of the server apparatus. The external device 18 is disposed on the bottom board 12 and has at least one second connector 28 (eight shown in FIG. 2, but not limited thereto). The second connector 28 is used to connect to the first connector 26 of the host device 16 for establishing electrical connection between the host device 16 and the external device 18.

Figure 3:
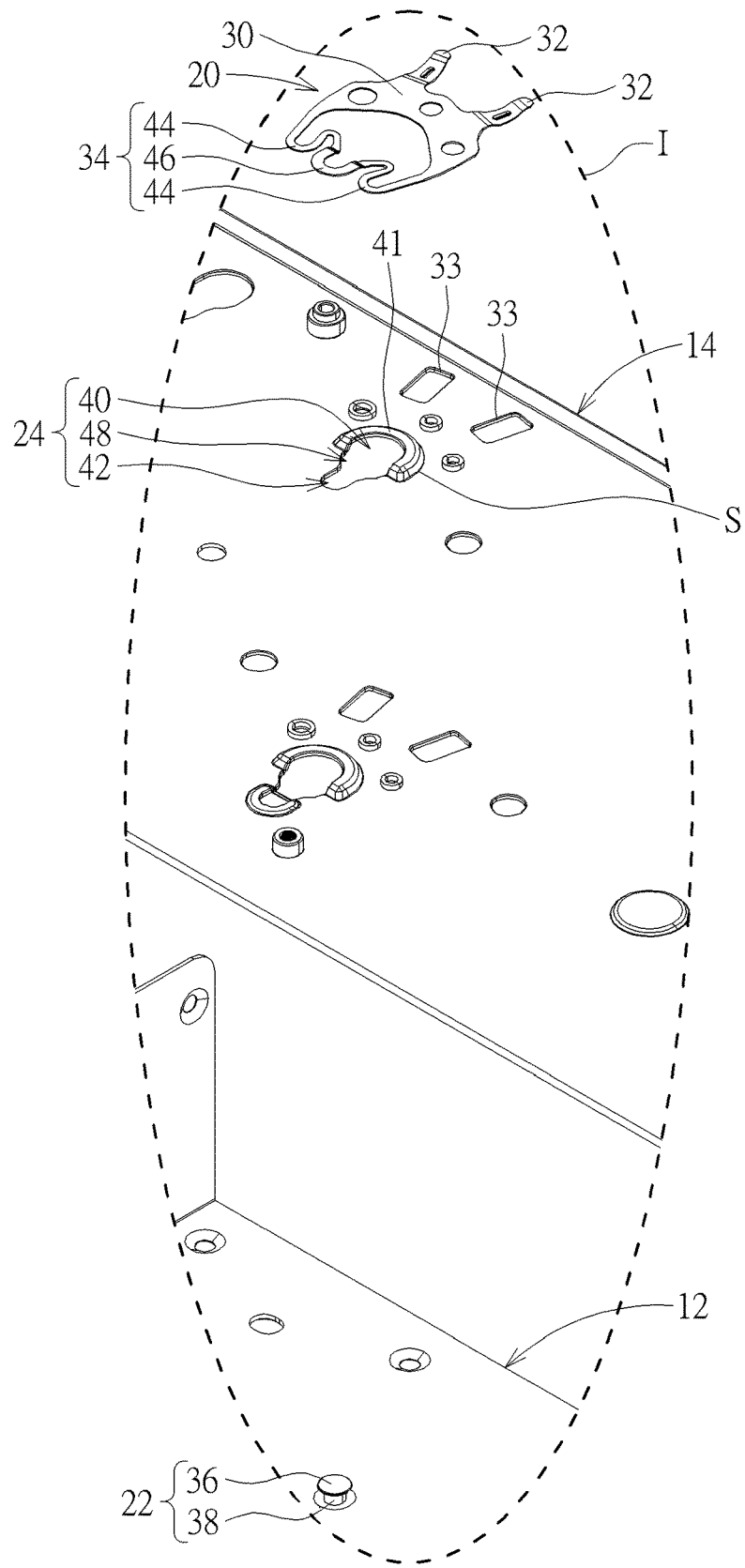
FIG. 3 is an enlarged diagram of an elastic piece, a bottom board and a tray within an I-region of FIG. 2.
Figure 4:
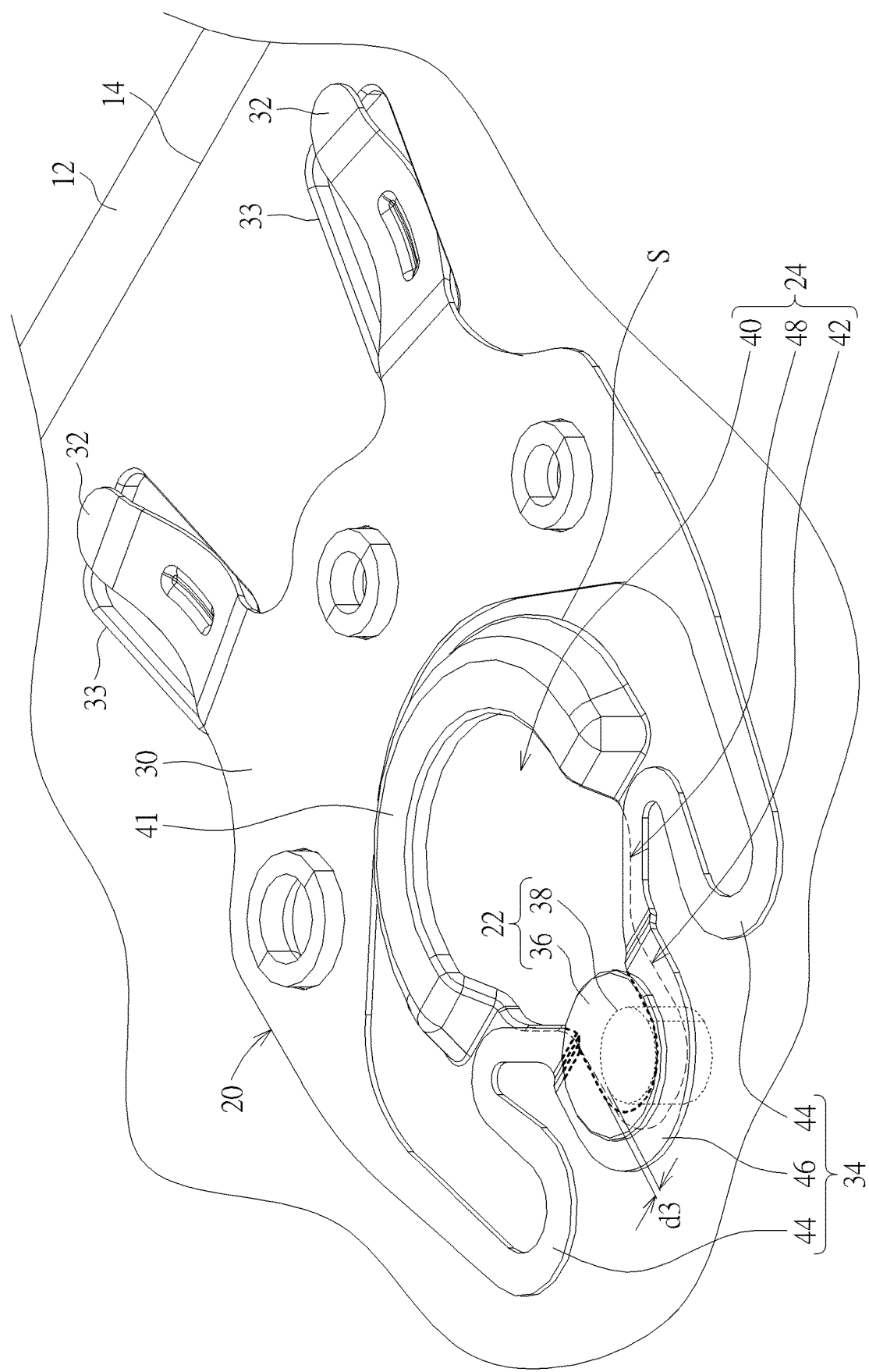
FIG. 4 is an assembly diagram of the elastic piece, the bottom board and the tray in FIG. 3.
Figure 5:
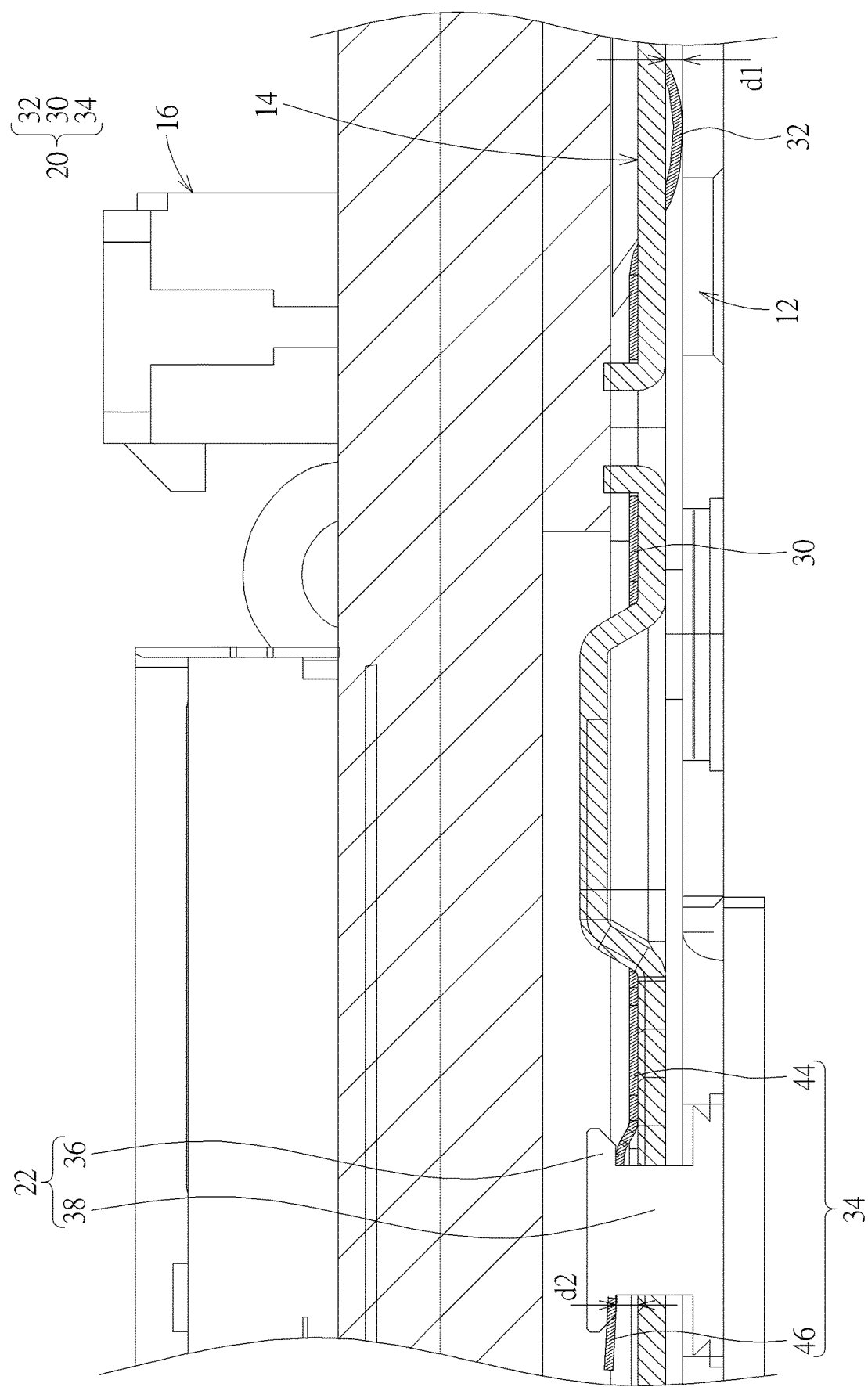
FIG. 5 is a partial enlarged cross-sectional diagram of the server apparatus in FIG. 1 along a cross-sectional line A-A.

More detailed description for the floating support design of the elastic piece 20, the bottom board 12 and the tray 14 is provided as follows. Please refer to FIGS. 3-5. FIG. 3 is an enlarged diagram of the elastic piece 20, the bottom board 12 and the tray 14 within an I-region of FIG. 2. FIG. 4 is an assembly diagram of the elastic piece 20, the bottom board 12 and the tray 14 in FIG. 3. FIG. 5 is a partial enlarged cross-sectional diagram of the server apparatus 10 in FIG. 1 along a cross-sectional line A-A. As shown in FIGS. 3-5, the elastic piece 20 includes a body 30, at least one elastic arm 32 (two shown in FIG. 3, but not limited thereto, meaning that the number of elastic arms (e.g., one or more than two) depends on the practical application of the server apparatus 10), and a hollow supporting piece 34. The body 30 could be preferably connected to the tray 14 by rivets (but not limited thereto, meaning that the present disclosure could adopt other fixing designs, such as the screw locking design). The elastic arm 32 extends from the body 30 to pass through the tray 14 (e.g., the elastic arm 32 being curved to protrude downward from a slot 33 of the tray 14 as shown in FIG. 3), for abutting against the bottom board 12 when the tray 14 is connected on the bottom board 12, such that the tray 14 can move down a first distance d1 relative to the bottom board 12 (as shown in FIG. 5). The first distance d1 could be preferably between 0.4 mm and 0.6 mm (e.g., 0.5 mm, but not limited thereto, meaning that the first distance d1 could be modified according to the practical application of the server apparatus 10).

As shown in FIGS. 3-5, the pin 22 could be preferably a T-shaped pin and has a T-shaped head portion 36 and a positioning rod portion 38. The hole 24 could have a through hole portion 40 and a positioning slot portion 42 correspondingly. The body 30 is adjacent to the through hole portion 40. The hollow supporting piece 34 extends from the body 30 to surround the hole 24 cooperatively with the body 30 and is tilted relative to the tray 14 to support the T-shaped head portion 36.

To be more specific, as shown in FIGS. 3-4, in this embodiment, the hollow supporting piece 34 could have two bridge arm portions 44 and a tongue portion 46, and the hole 24 could further have a tapered slot portion 48. The tapered slot portion 48 is communicated with the through hole portion 40 and the positioning slot portion 42 to guide the positioning rod portion 38 to smoothly slide into the positioning slot portion 42 after the T-shaped head portion 36 passes through the through hole portion 40, so as to position the tray 14 on the bottom board 12. The two bridge arm portions 44 extend respectively from two sides of the body 30 to be connected to the tongue portion 46, for making the tongue portion 46 support the T-shaped head portion 36. The tongue portion 46 could be preferably U-shaped (but not limited thereto). The bridge arm portion 44 could be preferably S-shaped to enhance supporting elasticity of the hollow supporting piece 34 (but not limited thereto, meaning that the present disclosure could adopt other bridge arm design, such as an inclined straight arm design or a curved arm design). The bridge arm portion 44 could extend along an edge of the tapered slot portion 48 for guiding the positioning rod portion 38 via its tapered arm structure to slide to a position where the tongue portion 46 supports the T-shaped head portion 36 (as shown in FIG. 4). Accordingly, when the T-shaped head portion 36 passes through the through hole portion 40 to allow the positioning rod portion 38 to slide to be positioned in the positioning slot portion 42, the hollow supporting piece 34 tilted relative to the tray 14 can abut against the T-shaped head portion 36, so as to make the tray 14 abut against the bottom board 12 and the positioning pin 22 via the elastic piece 20. As such, the tray 14 can move up a second distance d2 (as shown in FIG. 5) relative to the bottom board 12. The second distance d2 could be preferably between 0.3 mm and 0.5 mm (e.g., 0.4 mm, but not limited thereto, meaning that the second distance d2 could be modified according to the practical application of the server apparatus 10).

To be noted, as shown in FIG. 4, the positioning rod portion 38 and the tongue portion 46 could be spaced from each other by a third distance d3. The third distance d3 could be preferably between 0.4 mm and 0.6 mm (e.g., 0.5 mm, but not limited thereto, meaning that the third distance d3 could be modified according to the practical application of the server apparatus 10). Accordingly, the tray 14 can move horizontally relative to the bottom board 12, such that a user can flexibly adjust a mounting position of the first connector 26 of the tray 14 in a horizontal direction. Furthermore, in the practical application, an avoiding portion 41 could protrude from an edge S of the through hole portion 40, so as to efficiently prevent the T-shaped head portion 36 from interfering with the edge S of the through hole portion 40 or even getting struck when the T-shaped head portion 36 exits the through hole portion 40.

Via the aforesaid designs, when a user wants to assemble the host device 16 with the external device 18, the user just needs to mount the host device 16 and the external device 18 on the tray 14 and the bottom board 12, respectively, and then sleeves the hole 24 of the tray 14 on the pin 12 of the bottom board 12 to make the hollow supporting piece 34 support the T-shaped head portion 36 (as shown in FIG. 4). At this time, as shown in FIG. 4 and FIG. 5, via the design in which the elastic arm 32 abuts against the bottom board 12, the hollow supporting piece 34 supports the T-shaped head portion 36, and the positioning rod portion 38 is spaced from the tongue portion 46, the tray 14 can abut against the bottom board 12 and the pin 22 via the elastic piece 20. As such, the tray 14 can move the third distance d3 horizontally, move down the first distance d1, and move up the second distance d2 relative to the bottom board 12.

In such a manner, even if the host device 16 is misaligned with the external device 18 during the connector mating process, the user can still adjust a mounting position of the tray 14 relative to the bottom board 12 flexibly (e.g., lifting, pressing or laterally moving the tray 14) via the aforesaid floating support design for precisely aligning the first connector 26 of the host device 16 with the second connector 28 of the external device 18, so as to complete the connector mating operation of the host device 16 and the external device 18 quickly and smoothly. Thus, the present disclosure not only efficiently solves the assembly problem that the connectors are not assembled smoothly or even struck as mentioned in prior art, but also prevents damage of the connectors during the connector mating process.

It should be mentioned that the hollow supporting piece is an omissible component. In brief, in another embodiment in which the hollow supporting piece is omitted, the elastic piece could only have the elastic arm to abut against the bottom board when the tray is connected on the bottom board for making the tray only move down the first distance relative to the bottom board, so as to simplify the floating support design of the elastic piece of the present disclosure. As for other related description for this embodiment, it could be reasoned by analogy according to the aforesaid embodiments and omitted herein.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A server apparatus comprising:
   a bottom board having at least one pin;
   a tray having at least one hole and at least one slot, the pin being located in the hole to make the tray movably connected on the bottom board;
   a host device disposed on the tray and having at least one first connector; and
   at least one elastic piece comprising a body and at least one elastic arm, the body being connected on the tray, the elastic arm extending from the body to pass through the slot of the tray and float against the bottom board for floating support when the tray is connected on the bottom board, for allowing the tray to move down a first distance relative to the bottom board.

2. The server apparatus of claim 1, wherein the pin has a T-shaped head portion and a positioning rod portion, the hole has a through hole portion and a positioning slot portion, the T-shaped head portion passes through the through hole portion for allowing the positioning rod portion to slide to be positioned in the positioning slot portion, the body is adjacent to the through hole portion, the elastic piece further comprises a hollow supporting piece, and the hollow supporting piece extends from the body to surround the hole cooperatively with the body and is tilted relative to the tray to support the T-shaped head portion, to make the tray supported between the bottom board and the pin such that the tray can move a second distance relative to the bottom board.

3. The server apparatus of claim 2, wherein the first distance is between 0.4 mm and 0.6 mm, and the second distance is between 0.3 mm and 0.5 mm.

4. The server apparatus of claim 2, wherein an avoiding portion protrudes from an edge of the through hole portion.

5. The server apparatus of claim 2, wherein the hollow supporting piece has two bridge arm portions and a tongue portion, and the two bridge arm portions extend respectively from two sides of the body to be connected to the tongue portion for making the tongue portion support the T-shaped head portion.

6. The server apparatus of claim 5, wherein the hole further has a tapered slot portion, and the tapered slot portion is communicated with the through hole portion and the positioning slot portion to guide the positioning rod portion to slide from the through hole portion to the positioning slot portion, for making the T-shaped head portion supported on the tongue portion.

7. The server apparatus of claim 6, wherein the tongue portion is U-shaped, the bridge arm portion is S-shaped and extends along an edge of the tapered slot portion for guiding the positioning rod portion to slide to a position where the tongue portion supports the T-shaped head portion.

8. The server apparatus of claim 7, wherein the positioning rod portion and the tongue portion are spaced from each other by a third distance to make the tray movable horizontally relative to the bottom board.

9. The server apparatus of claim 8, wherein the third distance is between 0.4 mm and 0.6 mm.

10. The server apparatus of claim 1 further comprising:
an external device disposed on the bottom board and having at least one second connector;
wherein the tray is supported on the bottom board and can move the first distance relative to the bottom board for guiding the first connector to align with the second connector.

11. The server apparatus of claim 1, wherein the elastic arm extends from the body and is curved to protrude downward from the slot of the tray for abutting against the bottom board when the tray is connected on the bottom board.

12. An elastic piece suitable for supporting a tray above a bottom board of a server apparatus, the bottom board having at least one pin, the tray having at least one hole and at least one slot, the pin being located in the hole to make the tray movably connected on the bottom board, the elastic piece comprising:
a body connected on the tray; and
at least one elastic arm extending from the body to pass through the slot of the tray and float against the bottom board for floating support when the tray is connected on the bottom board, for allowing the tray to move down a first distance relative to the bottom board.

13. The elastic piece of claim 12, wherein the pin has a T-shaped head portion and a positioning rod portion, the hole has a through hole portion and a positioning slot portion, the T-shaped head portion passes through the through hole portion for allowing the positioning rod portion to slide to be positioned in the positioning slot portion, the body is adjacent to the through hole portion, the elastic piece further comprises a hollow supporting piece, and the hollow supporting piece extends from the body to surround the hole cooperatively with the body and is tilted relative to the tray to support the T-shaped head portion, to make the tray supported between the bottom board and the pin such that the tray can move a second distance relative to the bottom board.

14. The elastic piece of claim 13, wherein the second distance is between 0.3 mm and 0.5 mm.

15. The elastic piece of claim 13, wherein the hollow supporting piece has two bridge arm portions and a tongue portion, and the two bridge arm portions extend respectively from two sides of the body to be connected to the tongue portion for making the tongue portion support the T-shaped head portion.

16. The elastic piece of claim 15, wherein the hole further has a tapered slot portion, the tapered slot portion is communicated with the through hole portion and the positioning slot portion, the tongue portion is U-shaped, the bridge arm portion is S-shaped and extends along an edge of the tapered slot portion for guiding the positioning rod portion to slide to a position where the tongue portion supports the T-shaped head portion.

17. The elastic piece of claim 16, wherein the positioning rod portion and the tongue portion are spaced from each other by a third distance to make the tray movable horizontally relative to the bottom board.

18. The elastic piece of claim 17, wherein the third distance is between 0.4 mm and 0.6 mm.

19. The elastic piece of claim 12, wherein the elastic arm extends from the body and is curved to protrude downward from the slot of the tray for abutting against the bottom board when the tray is connected on the bottom board.

20. The elastic piece of claim 12, wherein the first distance is between 0.4 mm and 0.6 mm.

* * * * *